(12) United States Patent
Hanai

(10) Patent No.: US 11,528,030 B2
(45) Date of Patent: Dec. 13, 2022

(54) ANALOG INPUT DEVICE

(71) Applicant: DENSO WAVE INCORPORATED, Aichi-pref. (JP)

(72) Inventor: Takashi Hanai, Chita-gun (JP)

(73) Assignee: DENSO WAVE INCORPORATED, Aichi-Pref. (JP)

(*) Notice: Subject to any disclaimer, the term of this patent is extended or adjusted under 35 U.S.C. 154(b) by 277 days.

(21) Appl. No.: 17/020,876

(22) Filed: Sep. 15, 2020

(65) Prior Publication Data
US 2021/0083682 A1 Mar. 18, 2021

(30) Foreign Application Priority Data
Sep. 18, 2019 (JP) .............................. JP2019-169311

(51) Int. Cl.
*B25J 13/06* (2006.01)
*H03M 1/06* (2006.01)

(52) U.S. Cl.
CPC ........... *H03M 1/0617* (2013.01); *B25J 13/06* (2013.01)

(58) Field of Classification Search
CPC ... H03M 1/0617; B25J 13/06; G05B 19/0423; G05B 2219/21137
See application file for complete search history.

(56) References Cited

U.S. PATENT DOCUMENTS

| | | | |
|---|---|---|---|
| 8,217,822 B2* | 7/2012 | Lovitt | H03M 1/188 341/139 |
| 9,098,728 B2* | 8/2015 | Kishigami | G06F 21/84 |
| 10,678,151 B2* | 6/2020 | Holz | G03F 7/70508 |
| 2002/0120362 A1* | 8/2002 | Lathan | A63F 13/212 700/245 |
| 2010/0010672 A1* | 1/2010 | Wang | G05D 1/0225 901/1 |

FOREIGN PATENT DOCUMENTS

JP 2019-20822 A 2/2019

* cited by examiner

*Primary Examiner* — Kira Nguyen
(74) *Attorney, Agent, or Firm* — Harness, Dickey & Pierce, P.L.C.

(57) ABSTRACT

An analog input device, which converts an inputted analog signal to a digital signal and outputs the digital signal, includes a high resolution AD converter, a first low resolution AD converter, and a second low resolution AD converter. When a difference between a first digital signal converted by the high resolution AD converter and a second digital signal converted by the first low resolution AD converter is equal to or less than a predetermined first threshold, the analog input device outputs first digital signal. When the difference between the first digital signal and the second digital signal is larger than the predetermined first threshold, the analog input device stops an output of the first digital signal.

5 Claims, 6 Drawing Sheets

US 11,528,030 B2

ANALOG INPUT DEVICE

CROSS REFERENCE TO RELATED APPLICATION

The present application claims the benefit of priority from Japanese Patent Application No. 2019-169311 filed on Sep. 18, 2019. The entire disclosure of the above application is incorporated herein by reference.

TECHNICAL FIELD

The present disclosure relates to an analog input device which converts an inputted analog signal to a digital signal and outputs the converted digital signal.

BACKGROUND

There has been known an analog input device which includes high resolution analog to digital converters in redundant manner.

SUMMARY

An analog input device, which converts an inputted analog signal to a digital signal and outputs the digital signal, includes a high resolution AD converter, a first low resolution AD converter, and a second low resolution AD converter. When a difference between a first digital signal converted by the high resolution AD converter and a second digital signal converted by the first low resolution AD converter is equal to or less than a predetermined first threshold, the analog input device outputs first digital signal. When the difference between the first digital signal and the second digital signal is larger than the predetermined first threshold, the analog input device stops an output of the first digital signal. The analog input device further includes a first comparator. When a difference between the second digital signal and a third digital signal converted by the second low resolution AD converter is equal to or less than a predetermined second threshold, the analog input device permits an output of the first digital signal to the first comparator. When the difference between the second digital signal and the third digital signal is larger than the predetermined second threshold, the analog input device forbids the output of the first digital signal to the first comparator.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
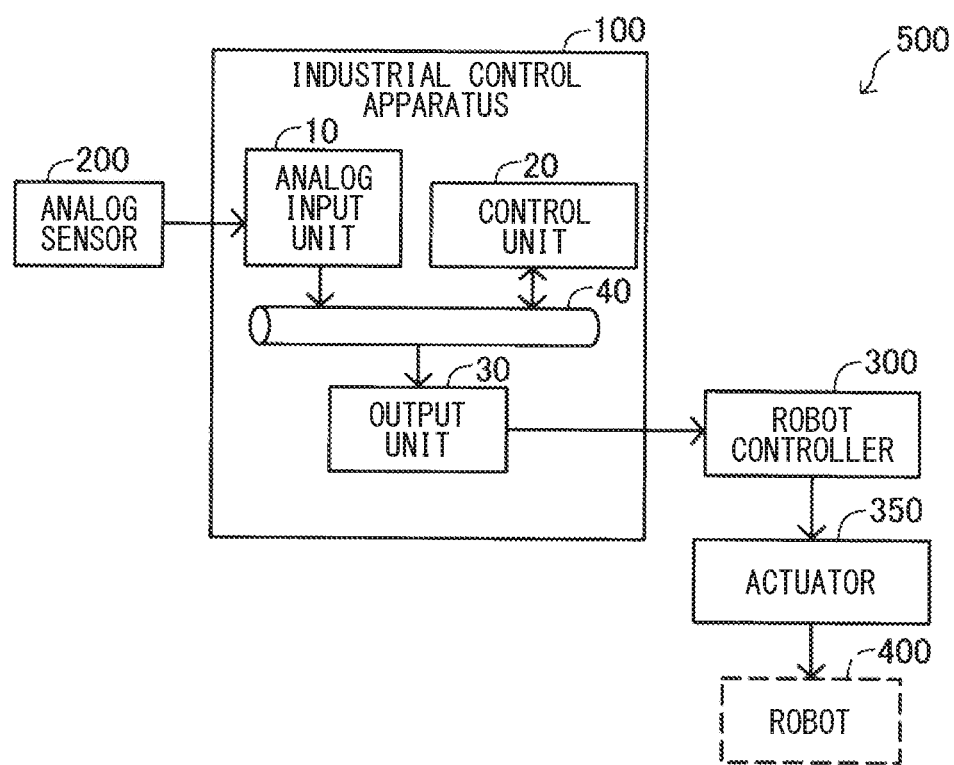
FIG. 1 is a block diagram showing a schematic configuration of a robot control system including an analog input unit corresponding to an analog input device according to an embodiment of the present disclosure.

An industrial control apparatus including a programmable logic controller (hereinafter, also referred to as PLC) drives, for example, an actuator for operating a robot using a detection result of one or more sensors, such as a position sensor or a temperature sensor. The industrial control apparatus includes, in addition to a control device (a control unit), an analog input device (input unit). The analog input device processes an analog signal output from a sensor by analog to digital conversion (hereinafter also referred to as AD conversion), and inputs the converted digital signal to the control device.

Functional safety design is required for the industrial control apparatus as a measure to enhance a safety when a failure occurs in the industrial control apparatus. For example, the analog input device may further include a redundant AD converter in addition to the AD converter. A comparator may compare a conversion result of the AD converter with a conversion result of the redundant AD converter, and determines an occurrence of a failure when detecting an error exceeding a predetermined value. Then, the detected failure is configured to notify to the control device.

In the configuration where the redundant AD converter is added and the conversion results of two AD converters are compared to detect a failure as described above, in order to meet the request for high resolution AD conversion, both of the AD converters adopt high resolution AD converter, and two sets of high resolution AD converters causes an increase in manufacturing cost. Further, in order to compare the conversion results of two high resolution AD converters, it is necessary to match a timing of the output signal from one AD converter with a timing of the output signal from the other AD converter with high accuracy. Thus, a microcomputer for controlling a synchronization needs to be arranged between each AD converter and the comparator, which causes an increase in the number of components and heat generation together with the redundant AD converter, thereby reducing a degree of circuit integration.

The above-described difficulties are common not only to the industrial control apparatus configured by the PLC but also to any industrial control apparatus including an analog input device. For this reason, the industrial control apparatus is required for suppressing an increase in manufacturing cost and a decrease in integration degree while enabling a high resolution AD conversion and high functional safety performance.

The present disclosure may be implemented in the following aspects.

According to an aspect of the present disclosure, an analog input device that is used in an industrial control apparatus is provided. The analog input device converts an analog signal input to the analog input device to a digital signal, and outputs the digital signal that is converted. The analog input device includes: a high resolution analog to digital converter executing an analog to digital conversion to the analog signal with a first resolution and outputting a first digital signal that is converted; a first microcomputer including a first low resolution analog to digital converter, the first low resolution analog to digital converter executing an analog to digital conversion to the analog signal with a second resolution and outputting a second digital signal that is converted, and the second resolution being lower than the first resolution; a second microcomputer including a second low resolution analog to digital converter, the second low resolution analog to digital converter executing an analog to digital conversion to the analog signal with the second resolution and outputting a third digital signal that is converted; a first comparator comparing the first digital signal output from the high resolution analog to digital converter with the second digital signal output from the first low resolution analog to digital converter as a first comparison process; a digital signal output unit outputting the first digital signal when a result of the first comparison process indicates that a difference between the first digital signal and the second digital signal is equal to or less than a predetermined first threshold, and the digital signal output unit stopping an output of the first digital signal when a result of the first comparison process indicates that the difference between the first digital signal and the second digital signal is larger than the predetermined first threshold; and a switching unit permits or forbids an output of the first digital signal to the first comparator according to an instruction output from at least one of the first microcomputer or the second microcomputer. At least one of the first microcomputer or the second microcomputer includes a second comparator that compares the second digital signal output from the first low resolution analog to digital converter with the third digital signal output from the second low resolution analog to digital converter as a second comparison process. When a result of the second comparison process indicates that a difference between the second digital signal and the third digital signal is equal to or less than a predetermined second threshold, the second comparator controls the switching unit to permit the output of the first digital signal to the first comparator. When a result of the second comparison process indicates that the difference between the second digital signal and the third digital signal is larger than the predetermined second threshold, the second comparator controls the switching unit to forbid the output of the first digital signal to the first comparator.

With this analog input device, a redundant high resolution AD converter is not needed. The abnormality of conversion accuracy deviation on a high-order bit side of the high resolution AD converter can be detected using the low resolution AD converters included in the first and second microcomputers. Thus, the high resolution AD conversion and high functional safety of the AD conversion can be ensured while an increase in the manufacturing cost and a decrease in the integration degree are suppressed compared with a comparative example in which two high resolution AD converters are arranged in the redundant manner. In the comparative example, each high resolution AD converter includes a microcomputer to detect an abnormality occurred in the high resolution AD conversion. As a result of the first comparison process, when the difference between the first digital signal and the second digital signal is equal to or less than the predetermined first threshold value, the first digital signal is output. When the difference between the first digital signal and the second digital signal is larger than the predetermined first threshold value, the output of the first digital signal is stopped. Thus, it is possible to suppress the output of the first digital signal which has the low AD conversion accuracy due to the abnormality occurred in the high resolution AD converter. As a result of the second comparison process, when the difference between the second digital signal and the third digital signal is equal to or less than the predetermined second threshold value, the switching unit is controlled to output the first digital signal to the first comparator. When the difference between the second digital signal and the third digital signal is larger than the predetermined second threshold value, the switching unit is controlled to stop the output of the first digital signal to the first comparator. Thus, when an abnormality occurs in the first microcomputer or in the second microcomputer thereby causing a failure in detecting the abnormality occurred in the high resolution AD converter with a high accuracy, the output of the first digital signal which may have a low accuracy can be suppressed. Therefore, a high functional safety of the analog input device can be provided.

In the above analog input device, the switching unit may be configured by a switching element arranged between the high resolution AD converter and the first comparator, With this analog input device, the switching unit can have a simple structure, and the control of the switching unit by the first microcomputer and the second microcomputer can be executed in a simple manner.

In the above analog input device, when the result of the first comparison process indicates that the difference between the first digital signal and the second digital signal is equal to or less than the predetermined first threshold, the digital signal output unit may output the first digital signal to an external device which is included in the industrial control apparatus via a communication bus of the industrial control apparatus. With this analog input device, the industrial control apparatus can use the high resolution AD conversion result. Therefore, the result of the high resolution AD conversion can be used in the control device, such as, control unit.

In the above analog input device, the analog signal may be output from a sensor, and the external device may be provided by a control device that generates a command according to a detection value of the analog signal output from the sensor and outputs the generated command to a robot controller that controls an operation of a robot. With this analog input device, the robot can be controlled with a high accuracy using the analog signal output from the sensor.

According to another aspect of the present disclosure, an analog input device, which converts an analog signal input to the analog input device to a digital signal and outputs the digital signal that is converted, is provided. The analog input device includes: a high resolution analog to digital converter executing an analog to digital conversion to the analog signal with a first resolution and outputting a first digital signal that is converted; a first microcomputer including a first low resolution analog to digital converter, the first low resolution analog to digital converter executing an analog to digital conversion to the analog signal with a second resolution and outputting a second digital signal that is converted, and the second resolution being lower than the first resolution; a second microcomputer including a second low resolution analog to digital converter, the second low resolution analog to digital converter executing an analog to digital conversion to the analog signal with the second resolution and outputting a third digital signal that is converted; an application specific integrated circuit including a first comparator, the first comparator comparing the first digital signal output from the high resolution analog to digital converter with the second digital signal output from the first low resolution analog to digital converter as a first comparison process, the application specific integrated circuit outputting the first digital signal when a result of the first comparison process indicates that a difference between the first digital signal and the second digital signal is equal to or less than a predetermined first threshold, and the application specific integrated circuit stopping an output of the first digital signal when a result of the first comparison process indicates that the difference between the first digital signal and the second digital signal is larger than the predetermined first threshold; and a switching element arranged between the high resolution analog to digital converter and the application specific integrated circuit, the switching element permits or forbids an output of the first digital signal to the first comparator according to an instruction output from at least one of the first microcomputer or the second microcomputer. At least one of the first microcomputer or the second microcomputer includes a second comparator that compares the second digital signal output from the first low resolution analog to digital converter with the third digital signal output from the second low resolution analog to digital converter as a second comparison process. When a result of the second comparison process indicates that a difference between the second digital signal and the third digital signal is equal to or less than a predetermined second threshold, the second comparator controls the switching element to permit the output of the first digital signal to the first comparator. When a result of the second comparison process indicates that the difference between the second digital signal and the third digital signal is larger than the predetermined second threshold, the second comparator controls the switching element to forbid the output of the first digital signal to the first comparator.

The present disclosure may be implemented by the following embodiments. For example, the present disclosure may be implemented by an industrial control apparatus, a programmable logic controller, a robot controller, an analog to digital converting device, a management device of an analog to digital converting device, a normality determination method of an analog to digital converting device; or the like.

FIG. 1 is a block diagram showing a schematic configuration of a robot control system 500 including an analog input unit 10. The analog input unit 10 is an embodiment of an analog input device according to the present disclosure. The robot control system 500 is configured to control an industrial robot 400, and controls the industrial robot 400 according to a detection value of an analog sensor 200. Hereinafter, the industrial robot 400 will be simply referred to as a robot 400. The robot control system 500 includes an industrial control apparatus 100, a robot controller 300, and an actuator 350 in addition to the analog sensor 200 described above.

The analog sensor 200 detects a value of a parameter related to an operation control of the robot 400, and outputs the detected value as an analog signal. In the present embodiment, the analog sensor 200 detects a voltage value as the value of the parameter related to the operation control of the robot 400, The analog sensor 200 has a total measuring range of 20 volts from −10 V volts to +10 volts, and outputs the voltage value detected within the measuring range as an analog value. The parameter relating to the operation control of the robot 400 is not limited to the above voltage value, and other parameters may be adopted. For example, when the robot 400 is an articulated industrial robot, the parameter may be a position or an angle of an arm or a wrist of the robot 400. The parameter may be a temperature of an environment in which the robot 400 operates. The parameter may be a moving distance of the robot 400 when the robot 400 moves. The parameter may be a weight measured at a predetermined position of a conveyance path for conveying a work piece to be processed by the robot 400, The parameter may be a fluid flow rate when the robot 400 controls a valve for controlling the fluid flow rate.

The industrial control apparatus 100 is electrically connected to the analog sensor 200 and the robot controller 300. The industrial control apparatus 100 receives an analog signal output from the analog sensor 200, executes an analog to digital conversion for obtaining a digital signal, generates an instruction signal based on the digital signal, and outputs the instruction signal to the robot controller 300. Hereinafter, the analog to digital conversion is also referred to as AD conversion, and the digital signal converted by the AD conversion is also referred to as a converted digital signal. In the present embodiment, the industrial control apparatus 100 is configured by a programmable logic controller. The programmable logic controller is also referred to as PLC. The industrial control apparatus 100 is capable of performing self-diagnosis for detecting an abnormality in a configuration performing the AD conversion in order to provide a high functional safety performance. The self-diagnosis function will be described later in detail. The industrial control apparatus 100 includes an analog input unit 10, a control unit 20, an output unit 30, and a communication bus 40. The analog input unit 10, the control unit 20, and the output unit 30 can communicate with each other via the communication bus 40.

The analog input unit 10 receives the analog signal output from the analog sensor 200, executes AD conversion to the analog signal, and outputs the converted digital signal to the control unit 20 via the communication bus 40. The analog input unit 10 has the self-diagnosis function described above. When the analog input unit 10 detects an abnormality as a result of the self-diagnosis, the analog input unit 10 outputs a signal indicating a detection of abnormality to the control unit 20 via the communication bus 40. A detailed configuration of the analog input unit 10 will be described later. The analog input unit 10 corresponds to the analog input device of the present disclosure.

The control unit 20 generates and outputs an instruction signal based on the converted digital signal output from the analog input unit 10, and outputs the instruction signal to the output unit 30. The instruction signal instructs an operation control of the robot 400. Further, when the control unit 20 receives, from the analog input unit 10, the signal indicating the detection of abnormality of the analog input unit 10, the instruction signal instructs an operation stop of the robot 400. In the present disclosure, the control unit 20 corresponds to an external device, and also corresponds to a control device.

The output unit 30 outputs the instruction signal transmitted from the control unit 20 to the robot controller 300.

The robot controller 300 controls the actuator 350 according to the instruction signal output from the industrial control apparatus 100, specifically, the output unit 30 of the industrial control apparatus 100. The actuator 350 drives the robot 400 to operate. For example, when the robot 400 includes an alternating current motor (AC motor), the actuator 350 may include an inverter circuit that supplies an electric power to the AC motor. In this configuration, the robot controller 300 is configured to output a signal for driving a switching element included in the inverter circuit. The robot controller 300 may be configured by, for example; a microcomputer.

Figure 2:
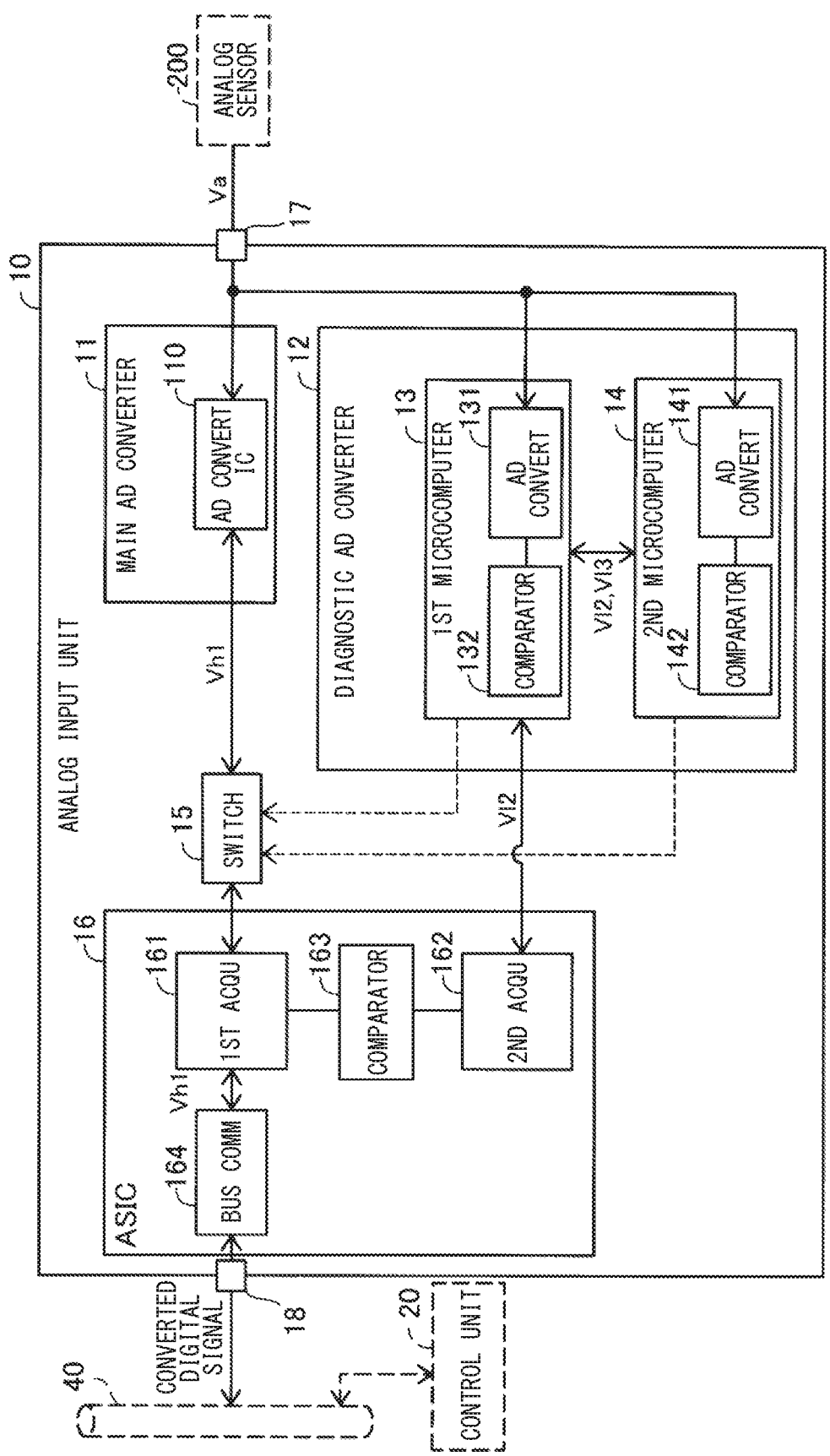
FIG. 2 is a block diagram showing a detailed configuration of the analog input unit.

FIG. 2 is a block diagram showing a detailed configuration of the analog input unit 10. The analog input unit 10 includes a main AD converter 11, a diagnostic AD converter 12, a switching unit (SWITCH) 15, an application specific integrated circuit (ASIC) 16, an analog signal input port 17, and a communication port 18.

The main AD converter 11 executes AD conversion to the analog signal Va input via the analog signal input port 17, and outputs the converted digital signal Vh1. The main AD converter 11 includes an AD conversion integrated circuit (AD convert IC) 110. The AD convert IC 110 is electrically connected to the analog signal input port 17 and the switching unit 15, The AD convert IC 110 executes AD conversion having a higher resolution than the diagnostic AD converter 12. Specifically, in the present embodiment, the AD convert IC 110 executes AD conversion with a resolution of 24 bits. Therefore, as described above; when a range of the voltage value indicated by the analog signal Va output from the analog sensor 200 is set to 20 V, the least significant bit (LSB) in the AD conversion executed by the AD convert IC 110 is approximately 0.001192 mV. The AD convert IC 110 outputs the converted digital signal Vh1 to the switching unit 15. The converted digital signal Vh1 output from the AD convert IC 110 is used in a first comparison process executed by the ASIC 16, The first comparison process will be described later. In the present disclosure, the converted digital signal Vh1 output from the AD convert IC 110 is also referred to as a first digital signal Vh1. The main AD converter 11 corresponds to a high resolution AD converter in the present disclosure. The resolution of AD conversion executed by the AD convert IC 110 corresponds to a first resolution in the present disclosure.

The diagnostic AD converter 12 is a self-diagnostic AD converter which detects an abnormality occurred in the main AD converter 11. The diagnostic AD converter 12 includes a first microcomputer 13 and a second microcomputer 14. The first microcomputer 13 and the second microcomputer 14 are connected in parallel with the analog signal input port 17 as a common connection point. The first microcomputer 13 and the second microcomputer 14 are configured to be communicable with each other through a communication wire. The first microcomputer 13 and the second microcomputer 14 are electrically connected to the switching unit 15. The first microcomputer 13 is electrically connected to the ASIC 16.

The first microcomputer 13 includes an AD conversion unit 131 and a comparator 132, The AD conversion unit 131 executes AD conversion to the analog signal Va input via the analog signal input port 17, and outputs the converted digital signal VI2 to the comparator 132. In the present embodiment, the converted digital signal VI2 output from the AD conversion unit 131 is also referred to as a second digital signal VI2. The AD conversion unit 131 also outputs the second digital signal VI2 to the second microcomputer 14. The AD conversion unit 131 also outputs the second digital signal VI2 to the ASIC 16. The AD conversion unit 131 is one of the basic function units included in the first microcomputer 13, and executes AD conversion at a lower resolution than the AD convert IC 110 included in the main AD converter 11. In the present embodiment, the AD conversion unit 131 executes AD conversion with a resolution of 12 bits, Therefore, as described above, when a range of the voltage value indicated by the analog signal Va output from the analog sensor 200 is set to 20 V, the LSB in the AD conversion executed by the AD conversion unit 131 is approximately 4.88 mV, The resolution of AD conversion executed by the AD conversion unit 131 corresponds to a second resolution in the present disclosure. The AD conversion unit 131 corresponds to a first low resolution AD conversion unit in the present disclosure. The resolution of AD conversion executed by the AD conversion unit 131 corresponds to a second resolution in the present disclosure.

The comparator 132 compares the second digital signal VI2 output from the AD conversion unit 131 with a digital signal VI3 output from the second microcomputer 14. The digital signal VI3 output from the second microcomputer 14 is also referred to as a third digital signal. The comparison of the second digital signal VI2 and the third digital signal VI3 is also referred to as a second comparison process in the present disclosure. In the comparison of the second digital signal VI2 with the third digital signal VI3, an average value of the second digital signal VI2 is compared with an average value of the third digital signal VI3 during a unit period to obtain a difference therebetween. When the difference ΔVI between the second digital signal VI2 and the third digital signal VI3 is equal to or less than a predetermined second threshold value Vth2, the comparator 132 outputs a control signal to the switching unit 15 so that the switching unit 15 outputs the first digital signal Vh1, which is output from the AD convert IC 110, to the ASIC 16. When the difference ΔVI is larger than the predetermined second threshold value Vth2, the comparator 132 outputs a control signal to the switching unit 15 so that the switching unit 15 stops an output of the first digital signal Vh1 to the ASIC 16. A first threshold value Vth1 is set to be different from the second threshold value Vth2. The first threshold value Vth1 is used in a process executed by the ASIC 16, which will be described later. Details of the first threshold value Vth1 will be described later. The comparator 132 corresponds to a second comparator in the present disclosure. The control signal output from the comparator 132 is also referred to as an instruction.

The second microcomputer 14 has a configuration similar to the first microcomputer 13. The second microcomputer 14 includes an AD conversion unit 141 and a comparator 142. The AD conversion unit 141 executes an AD conversion at the same resolution as the AD conversion unit 131, and outputs the converted digital signal VI3 to the comparator 142 and the first microcomputer 13. In the present embodiment, the converted digital signal VI3 output from the AD conversion unit 141 corresponds to the third digital signal VI3. The comparator 142 compares the third digital signal VI3 output from the AD conversion unit 141 with the second digital signal VI2 output from the first microcomputer 13. When the difference ΔVI between the second digital signal VI2 and the third digital signal VI3 is equal to or less than the predetermined second threshold value Vth2, the comparator 142 outputs a control signal to the switching unit 15 so that the switching unit 15 outputs the first digital signal Vh1, which is output from the AD convert IC 110, to the ASIC 16. When the difference ΔVI is larger than the predetermined second threshold value Vth2, the comparator 142 outputs a control signal to the switching unit 15 so that the switching unit 15 stops an output of the first digital signal Vh1 to the ASIC 16. The AD conversion unit 141 corresponds to a second low resolution AD conversion unit in the present disclosure.

When the difference ΔVI between the second digital signal VI2 and the third digital signal VI3 is larger than the second threshold value Vth2 as a result of the second comparison process executed by the two microcomputers 13 and 14, the first microcomputer 13 or the second microcomputer 14 is highly likely to be abnormal. As described above, when the self-diagnosis does not function normally, the control signal, which stops an input of the first digital signal Vh1 to the ASIC 16, is output to the switching unit 15. Thus, an output of the first digital signal Vh1 to the control unit 20 is prevented in a situation where an abnormality of the main AD converter 11 cannot be detected. As described above, the AD conversion resolutions of the AD conversion units 131, 141 of the respective microcomputers 13, 14 are lower than the AD conversion resolution of the AD convert IC 110 of the main AD converter 11. As described above, by arranging two AD conversion units 131 and 141 in parallel with each other and comparing the AD conversion results of two AD conversion units 131 and 141, an abnormality can be detected and the self-diagnosis accuracy of the diagnostic AD converter 12 can be improved. Therefore, a self-diagnosis accuracy of the analog input unit 10 can be improved as compared with a configuration in which a single low-resolution AD converter is arranged in parallel with the main AD converter 11 to execute self-diagnosis.

The switching unit 15 determines whether to output the first digital signal Vh1 to the ASIC 16 according to a control signal from the first microcomputer 13 or the second microcomputer 14. The control signal is also referred to as a command. In the present embodiment, the switching unit 15 is configured by a switching element such as a transistor. The control signal output from the first microcomputer 13 or the second microcomputer 14 is supplied to the switching unit 15 as a gate signal.

The ASIC 16 includes a first acquisition unit (1ST ACQU) 161, a second acquisition unit (2ND ACQU) 162, a comparator 163, and a bus communication unit (BUS COMM) 164. The first acquisition unit 161 includes a buffer. The first acquisition unit 161 acquires the first digital signal Vh1 input via the switching unit 15, and temporarily stores the first digital signal Vh1. The second acquisition unit 162 includes a buffer. The second acquisition unit 162 acquires the second digital signal VI2 input from the AD conversion unit 131 of the first microcomputer 13, and temporarily stores the second digital signal VI2.

The comparator 163 compares the first digital signal Vh1 temporarily stored in the first acquisition unit 161 with the second digital signal VI2 temporarily stored in the second acquisition unit 162. The comparison of the first digital signal Vh1 with the second digital signal VI2 is also referred to as the first comparison process. In the comparison of the first digital signal Vh1 with the second digital signal VI2, an average value of the first digital signal Vh1 is compared with an average value of the second digital signal VI2 during a unit period to obtain the difference therebetween. As a result of the first comparison process, when the difference $\Delta$Vh between the first digital signal Vh1 and the second digital signal VI2 is equal to or less than a predetermined first threshold value Vth1, the comparator 163 outputs the first digital signal Vh1 temporarily stored in the first acquisition unit 161 to the control unit 20 via the bus communication unit 164 and the communication bus 40. When the difference $\Delta$Vh between the first digital signal Vh1 and the second digital signal VI2 is larger than the first threshold value Vth1, the comparator 163 stops an output of the first digital signal Vh1. In the present embodiment, the comparator 163 determines a detection of an abnormality when the difference $\Delta$Vh between the first digital signal Vh1 and the second digital signal VI2 is larger than the first threshold value Vth1. Then, the comparator 163 outputs a signal indicating the detection of the abnormality to the control unit 20 via the bus communication unit 164 and the communication bus 40. The bus communication unit 164 communicates with other devices via the communication bus 40. The comparator 163, the first acquisition unit 161, and the second acquisition unit 162 correspond to a first comparator in the present disclosure. The bus communication unit 164 corresponds to a digital signal output unit in the present disclosure.

When the difference $\Delta$Vh between the first digital signal Vh1 and the second digital signal VI2 is larger than the first threshold value Vth1, the main AD converter 11 or the diagnostic AD converter 12 may have an abnormality. When an abnormality occurs in the main AD converter 11, the abnormality decreases an accuracy of the first digital signal Vh1, and a value of the first digital signal Vh1 may be significantly different from a value of the second digital signal VI2 that shows a correct analog value. Therefore, the first digital signal Vh1 is not output to the control unit 20. When an abnormality occurs in the diagnostic AD converter 12, the abnormality decreases an accuracy of the second digital signal VI2. Thus, the accuracy of the first digital signal Vh1 can no longer be ensured even when the first digital signal Vh1 is compared with the second digital signal VI2. Therefore, the first digital signal Vh1 is also not output to the control unit 20. With this configuration, a functional safety of the industrial control apparatus 100 can be ensured.

The analog signal input port 17 is electrically connected with the analog sensor 200, and inputs, to the analog input unit 10, the analog signal Va output from the analog sensor 200. The analog signal input port 17 is connected with the main AD converter 11 and each microcomputer 13, 14 of the diagnostic AD converter 12. The analog signal input port 17 inputs the analog signal Va to the main AD converter 11 and each microcomputer 13, 14 of the diagnostic AD converter 12. The communication port 18 is electrically connected to the communication bus 40 and the bus communication unit 164.

Figure 3:
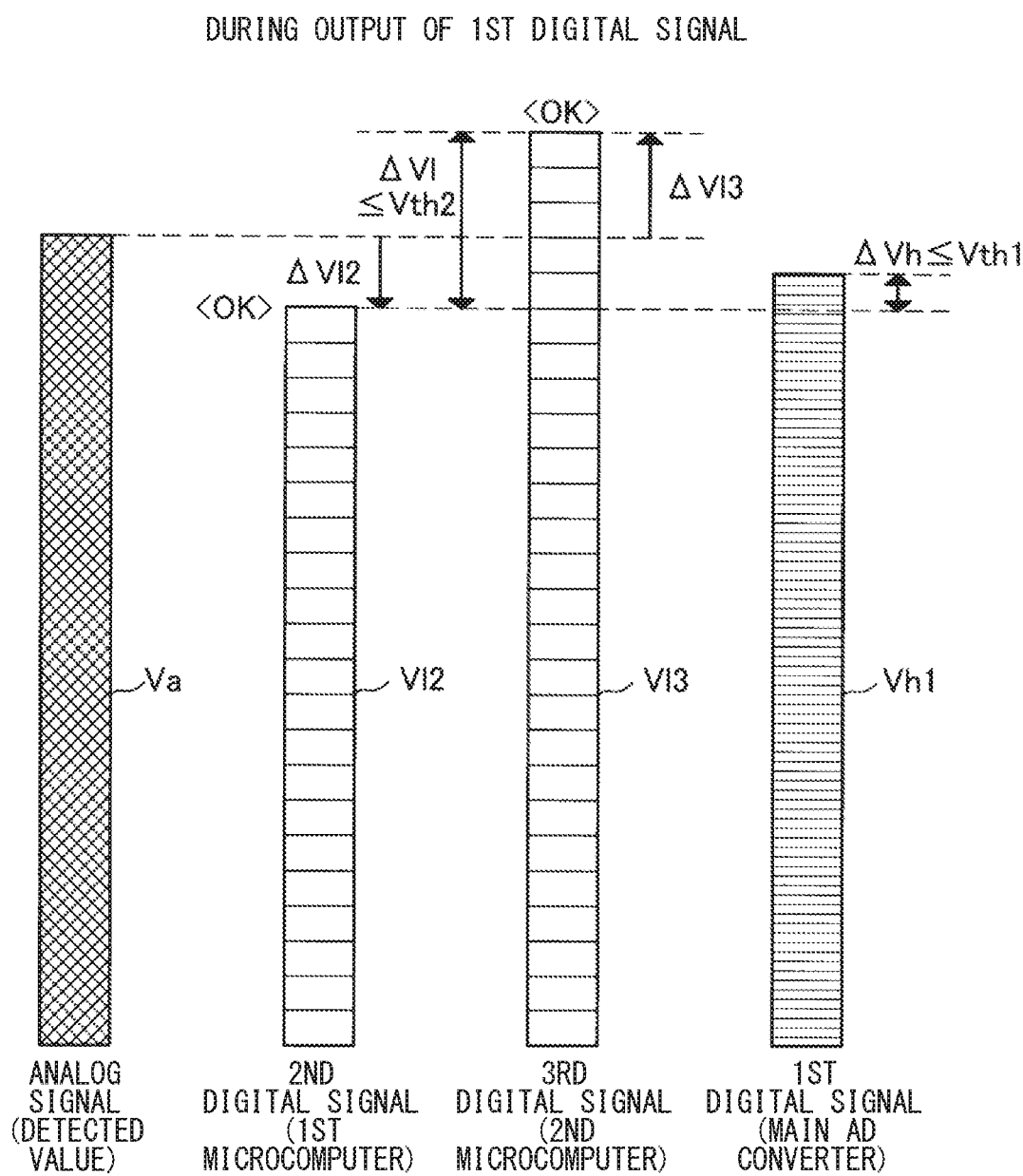
FIG. 3 is a diagram schematically showing an analog signal, a first digital signal, a second digital signal, and a third digital signal while the first digital signal is being output to a control unit.
Figure 4:
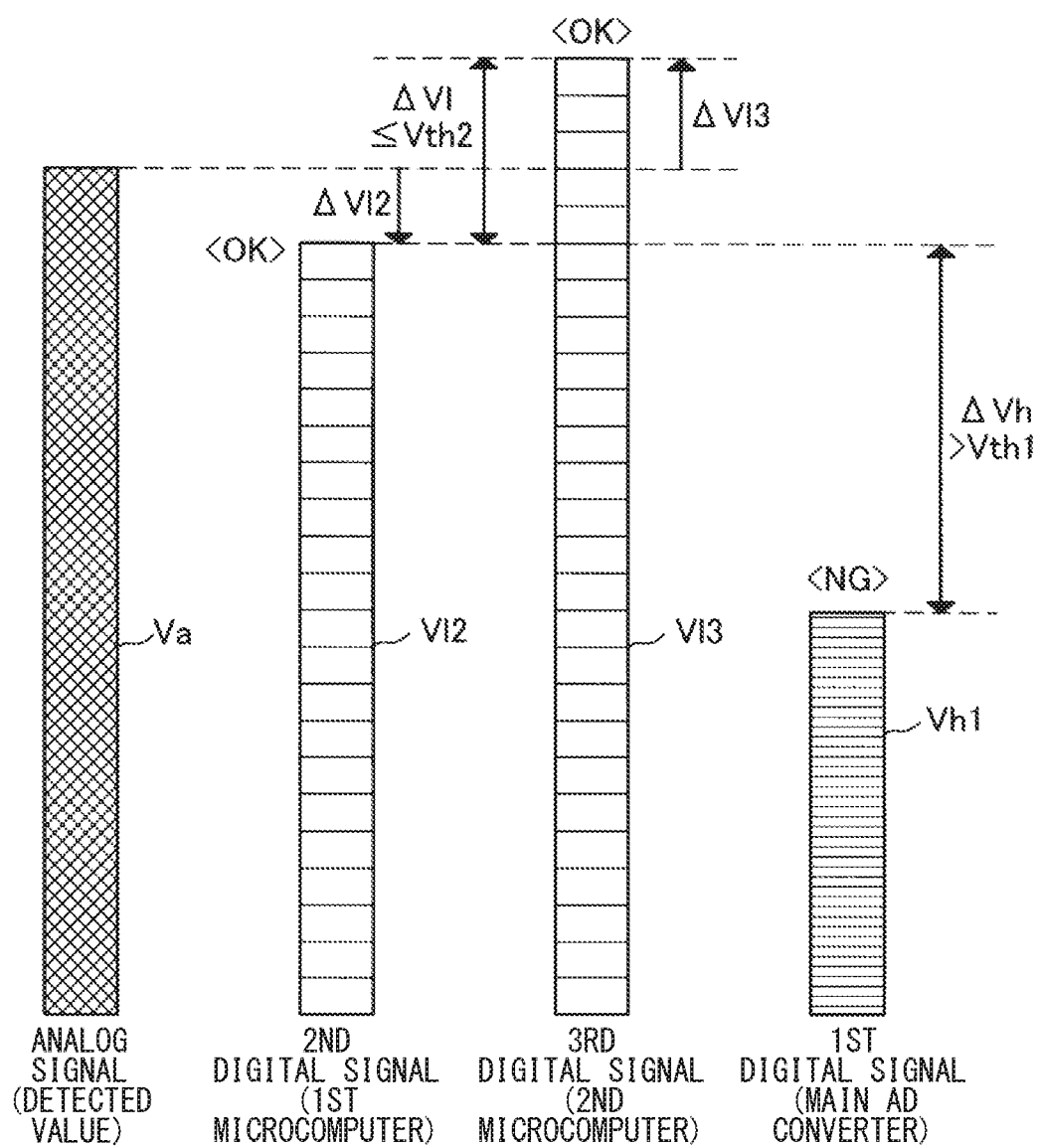
FIG. 4 is a diagram schematically showing an analog signal, a first digital signal, a second digital signal, and a third digital signal while an output of the first digital signal to a control unit is stopped.
Figure 5:
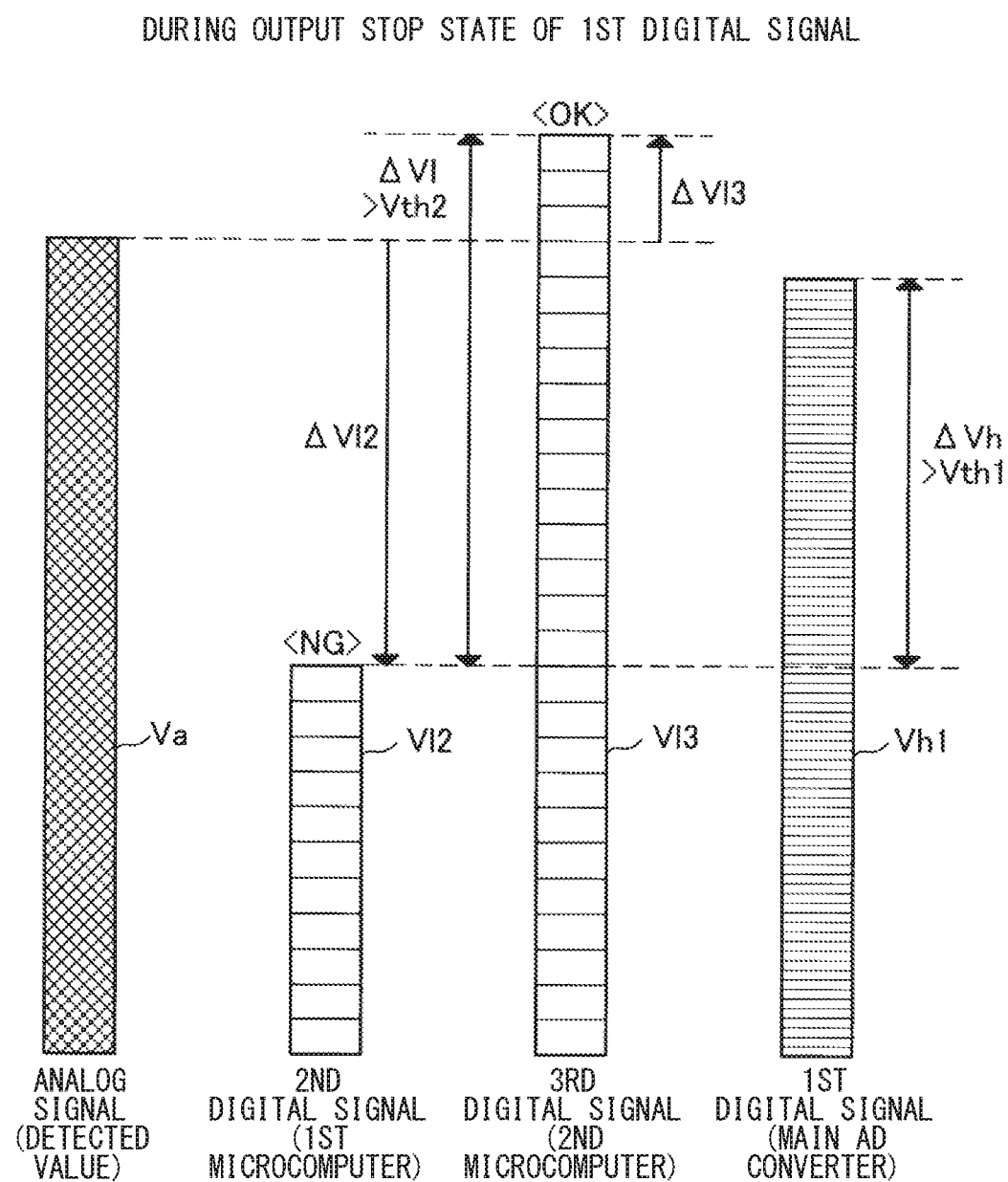
FIG. 5 is a diagram schematically showing an analog signal, a first digital signal, a second digital signal; and a third digital signal while an output of the first digital signal to a control unit is stopped.

FIG. 3 is a diagram schematically showing the analog signal Va, the first digital signal Vh1; the second digital signal VI2, and the third digital signal VI3 while the output of the first digital signal Vh1 to the control unit 20 is being executed. FIG. 4 and FIG. 5 each is a diagram schematically showing the analog signal Va, the first digital signal Vh1, the second digital signal VI2, and the third digital signal VI3 while the output of the first digital signal Vh1 to the control unit 20 is stopped. In FIG. 3 to FIG. 5, the leftmost signal is the analog signal Va. In FIG. 3 to FIG. 5, the second signal from the left is the second digital signal VI2, the third signal from the left is the third digital signal VI3, and the rightmost signal is the first digital signal Vh1. It should be noted that each signal represents an average value of each signal during a unit period. A vertical length of each signal indicates a magnitude of the voltage.

In a case shown in FIG. 3, the difference $\Delta$VI between the second digital signal VI2 and the third digital signal VI3 is equal to or less than the second threshold value Vth2. In this case, a conversion error in the AD conversion unit 131 of the first microcomputer 13, that is, a difference $\Delta$VI2 between the analog signal Va and the second digital signal VI2 is relatively small. Similarly, a conversion error in the AD conversion unit 141 of the second microcomputer 14, that is, a difference $\Delta$VI3 between the analog signal Va and the third digital signal VI3 is relatively small. In such a case, it may be determined that no abnormality is occurred in the diagnostic AD converter 12. In the case shown in FIG. 3, the difference $\Delta$Vh between the first digital signal Vh1 and the second digital signal VI2 is equal to or less than the first threshold value Vth1 Therefore, the first digital signal Vh1 is output to the control unit 20.

In a case shown in FIG. 4, similar to the case shown in FIG. 3, the difference $\Delta$VI is equal to or less than the second threshold value Vth2. Thus, it may be determined that no abnormality is occurred in the diagnostic AD converter 12.

Under a condition that the difference ΔVI is equal to or less than the second threshold value Vth2, when the difference ΔVh between the first digital signal Vh1 and the second digital signal VI2 is larger than the first threshold value Vth1, it is determined that the main AD converter 11 or the diagnostic AD converter 12 may have an abnormality. Therefore, an output of the first digital signal Vh1 to the control unit 20 is stopped.

In a case shown in FIG. 5, suppose that the difference between the first digital signal Vh1 and the analog signal Va is small, that is, the conversion error in the AD convert IC 110 of the main AD converter 11 is small. However, the difference ΔVI2, which is the conversion error in the AD conversion unit 131 of the first microcomputer 13, is large. Thus, the difference ΔVI between the second digital signal VI2 and the third digital signal VI3 is larger than the second threshold value Vth2. In this case, even when the accuracy of the analog signal Va is high, the reliability of the analog signal Va cannot be guaranteed, Therefore, in this case, the first threshold value Vth1 is set in advance such that the difference ΔVh between the converted digital signal Vh1 and the second digital signal VI2 is larger than the first threshold value Vth1. With this setting of the first threshold value Vth1, an output of the first digital signal Vh1 to the control unit 20 can be stopped.

Figure 6:
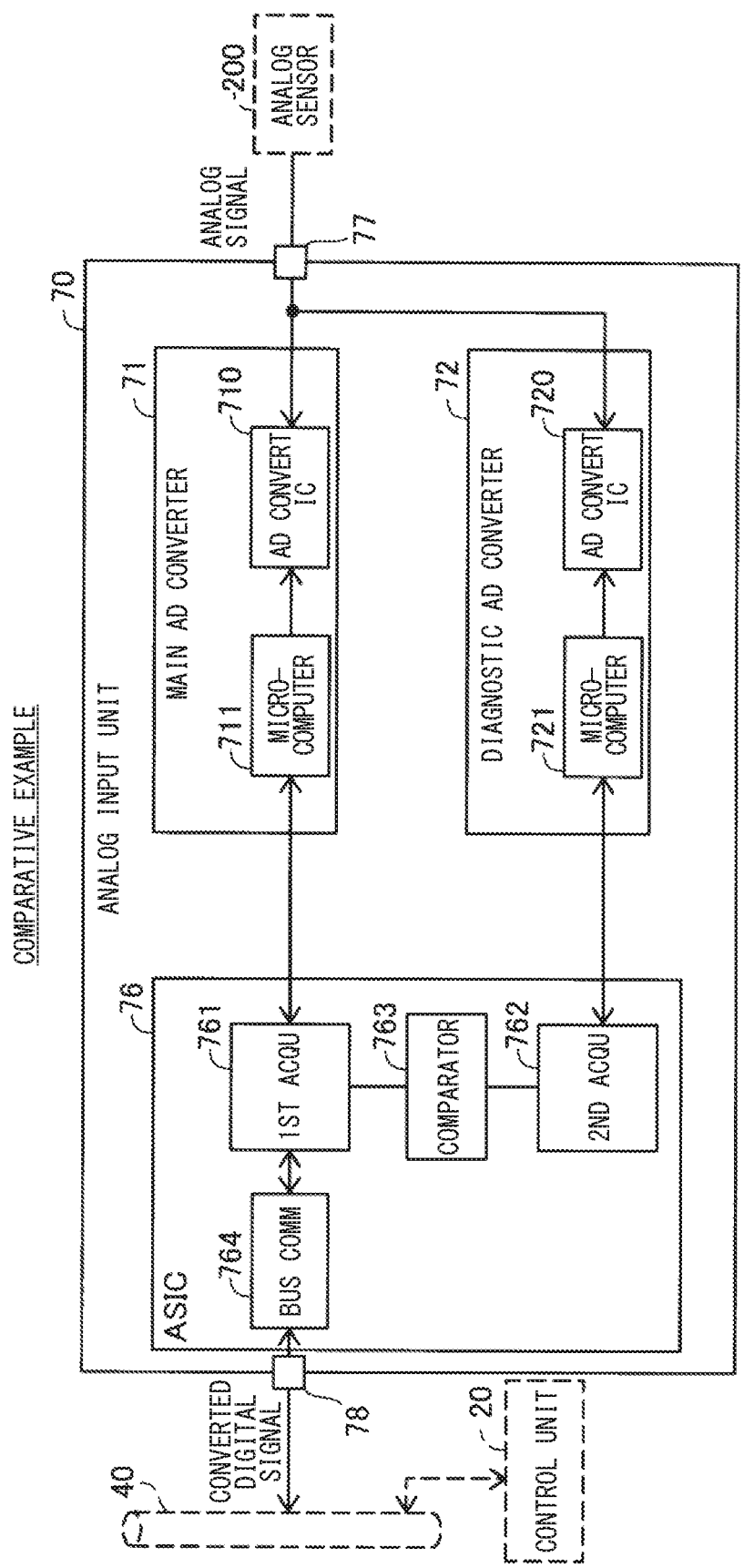
FIG. 6 is a block diagram showing a detailed configuration of an analog input unit according to a comparative example.

FIG. 6 is a block diagram showing a detailed configuration of an analog input unit 10 according to a comparative example. The analog input unit 70 includes a main AD converter 71, a diagnostic AD converter 72, an ASIC 76, an analog signal input port 77, and a communication port 78.

The main AD converter 71 includes an AD convert IC 710 and a microcomputer 711, The diagnostic AD converter 72 includes an AD convert IC 720 and a microcomputer 721. The main AD converter 71 and the diagnostic AD converter 72 have almost the same configuration and are connected in parallel to the analog signal input port 77. Each AD convert IC 710, 720 executes AD conversion with high resolution. The microcomputer 711 and the microcomputer 721 are arranged to synchronize a signal output timing of the AD convert IC 710 with a signal output timing of the AD convert IC 720. Specifically, when each microcomputer 711, 721 receives, from the ASIC 76, a request for signal which is outputted at a predetermined timing, the microcomputer 711, 721 outputs, to the ASIC 76, the digital signal converted by the corresponding AD convert IC 710, 720 at the requested predetermined timing.

The ASIC 76 includes a first acquisition unit (1ST ACQU) 761, a second acquisition unit (2ND ACQU) 762, a comparator 763, and a bus communication unit (BUS COMM) 764, The first acquisition unit 761 and the second acquisition unit 762 have similar functions to the first acquisition unit 161 and the second acquisition unit 162 of the present disclosure, respectively. The comparator 763 compares the digital signal obtained by the AD conversion in the AD convert IC 710 and the digital signal obtained by the AD conversion in the AD convert IC 720. When the difference between the two digital signals is equal to or less than a predetermined threshold value, the digital signal obtained by the AD conversion in the AD convert IC 710 is output to the control unit 20. When the difference between the two digital signals is larger than the threshold value, an output of the digital signal obtained by the AD conversion in the AD convert IC 710 to the control unit 20 is stopped.

According to the above-described analog input unit 70 of the comparative example, since two AD convert ICs each of which executes high resolution AD conversion are provided, the manufacturing cost of the analog input unit 70 is increased and the integration degree of the analog input unit 70 is decreased.

According to the analog input unit 10 of the above-described embodiment of the present disclosure, the high resolution AD converter, that is, the main AD converter 11 is not provided in a redundant manner. Instead, the first microcomputer 13 and the second microcomputer 14 have respective low resolution AD conversion units 131, 141. The abnormality occurred in the main AD converter 11 can be detected by the low resolution AD conversion units 131, 141. Thus, compared with the comparative example, a high resolution AD conversion and a high functional safety of the AD conversion can be ensured while an increase in the manufacturing cost of the analog input unit 10 and a decrease in the integration degree of the analog input unit are suppressed. As a result of the first comparison process, when the difference ΔVh between the first digital signal Vh1 and the second digital signal VI2 is equal to or less than the predetermined first threshold value Vth1, the first digital signal Vh1 is output to the control unit 20. When the difference ΔVh is larger than the predetermined first threshold value Vth1, the output of the first digital signal Vh1 to the control unit 20 is stopped. Thus, it is possible to suppress the output of the first digital signal Vh1 which has the low AD conversion accuracy due to the abnormality of the main AD converter 11. As a result of the second comparison process, when the difference ΔVI between the second digital signal VI2 and the third digital signal VI3 is equal to or less than the predetermined second threshold value Vth2, the switching unit 15 is controlled to output the first digital signal Vh1 to the ASIC 16. When the difference ΔVI between the second digital signal VI2 and the third digital signal VI3 is larger than the predetermined second threshold value Vth2, the switching unit 15 is controlled to stop the output of the first digital signal Vh1 to the ASIC 16. Thus, when an abnormality occurs in the first microcomputer 13 or in the second microcomputer 14 thereby causing a failure in detecting the abnormality occurred in the main AD converter 11 at a high accuracy, the output of the first digital signal Vh1 which may have low accuracy can be suppressed. Therefore, a high functional safety of the analog input unit 10 can be provided.

The switching unit 15 is configured by the switching element arranged between the main AD converter 11 and the ASIC 16. Thus, the switching unit 15 can have a simple structure, and the control of the switching unit by the first microcomputer 13 and the second microcomputer 14 can be executed in a simple manner.

As a result of the first comparison process, when the difference ΔVh between the first digital signal Vh1 and the second digital signal VI2 is equal to or less than the first threshold value Vth1, the first digital signal Vh1 is output to the control unit 20 via the communication bus 40. Thus, the robot 400 can be controlled using the high resolution AD conversion result corresponding to the output signal from the analog sensor 200, Thus, the industrial robot 400 can be controlled to operate with high precision.

Other Embodiments

In the above embodiment, the switching unit 15 is configured by the switching element. Alternatively, the switching unit 15 may include another device or circuit having a switching function, instead of the switching element. For example, the switching unit may include a microcomputer. For example, one of the first microcomputer 13 or the second microcomputer 14 may function as the switching unit 15. In this case, the first microcomputer 13 or the second microcomputer 14 may include the switching unit 15 as a functional unit.

In the above embodiment, as a result of the first comparison process, when the difference ΔVh between the first digital signal Vh1 and the second digital signal Vl2 is equal to or less than the first threshold value Vth1, the first digital signal Vh1 is output to the control unit 20 via the communication bus 40. Alternatively, the industrial control apparatus 100 may include a storage medium provided by a non-volatile memory, and the first digital signal Vh1 may be output to and stored in the storage medium of the industrial control apparatus 100 via the communication bus 40. Alternatively, the analog input unit 10 may include a storage medium provided by a non-volatile memory, and the first digital signal Vh1 may be output to and stored in the storage medium of the analog input unit 10. Then, the first digital signal Vh1 stored in the storage medium may be output to another external device via the communication bus 40.

The industrial control apparatus 100 is not limited to the robot control system 500 that controls the industrial robot 400. The present disclosure may be applied to control any industrial equipment or industrial machine having an AD conversion function.

In the above embodiment, both the first microcomputer 13 and the second microcomputer 14 output the control signals to the switching unit 15. Instead of this configuration, only one of the microcomputers may transmit the control signal. In such a configuration, the comparator may be omitted in the microcomputer that does not output the control signal. Further, instead of the AD conversion unit 131 that outputs the second digital signal Vl2 to the ASIC 16, the AD conversion unit 141 may output the third digital signal Vl3 to the ASIC 16. In this configuration, the comparator 163 compares the first digital signal Vh1 with the third digital signal Vl3.

In the above embodiment, the resolution of the AD convert IC 110 is set to 24 bits, and the resolution of each AD conversion unit 131, 141 is set to 12 bits. The resolutions of the AD convert IC and AD conversion units are not limited to the examples described in the above embodiment. The resolutions can be set appropriately different from the above embodiment under a condition that the resolution of the AD convert IC 110 is set to be higher than the resolution of each AD conversion unit 131, 141.

In the above-described embodiment, a part of the configuration implemented by hardware may be replaced with software, and conversely, a part of the configuration implemented by software may be replaced with hardware. For example, at least one of the comparator 132 or the comparator 142 may be implemented by an integrated circuit, a discrete circuit, or a module which combines the integrated circuit with the discrete circuit. Further, when partial or all of the functions in the present disclosure is implemented by software, the software, that is, the computer program can be provided as the computer program itself or can be provided as a computer-readable non-transitive storage medium that stores the computer program. The computer-readable non-transitive storage medium is not limited to a portable storage medium, such as a flexible disk or a CD-ROM, but also includes an internal storage device, such as RAM or ROM included in the computer. The computer-readable non-transitive storage medium also includes a hard disk which is connected to the computer as an external storage device. That is, the computer-readable non-transitive storage medium has a broad meaning including any storage medium in which data can be stored in fixed manner but not temporarily.

The present disclosure should not be limited to the embodiments described above, and various other embodiments may be implemented without departing from the scope of the present disclosure. For example, the technical features in the embodiments can be replaced or combined as appropriate. Also, some of the technical features may be omitted as appropriate.

What is claimed is:

1. An analog input device, which converts an analog signal input to the analog input device to a digital signal and outputs the digital signal that is converted, the analog input device comprising:
    a high resolution analog to digital converter executing an analog to digital conversion to the analog signal with a first resolution and outputting a first digital signal that is converted;
    a first microcomputer including a first low resolution analog to digital converter, the first low resolution analog to digital converter executing an analog to digital conversion to the analog signal with a second resolution and outputting a second digital signal that is converted, and the second resolution being lower than the first resolution;
    a second microcomputer including a second low resolution analog to digital converter, the second low resolution analog to digital converter executing an analog to digital conversion to the analog signal with the second resolution and outputting a third digital signal that is converted;
    a first comparator comparing the first digital signal output from the high resolution analog to digital converter with the second digital signal output from the first low resolution analog to digital converter as a first comparison process;
    a digital signal output unit outputting the first digital signal when a result of the first comparison process indicates that a difference between the first digital signal and the second digital signal is equal to or less than a predetermined first threshold, and the digital signal output unit stopping an output of the first digital signal when a result of the first comparison process indicates that the difference between the first digital signal and the second digital signal is larger than the predetermined first threshold; and
    a switching unit permits or forbids an output of the first digital signal to the first comparator according to an instruction output from at least one of the first microcomputer or the second microcomputer,
    wherein
    at least one of the first microcomputer or the second microcomputer includes a second comparator that compares the second digital signal output from the first low resolution analog to digital converter with the third digital signal output from the second low resolution analog to digital converter as a second comparison process,
    when a result of the second comparison process indicates that a difference between the second digital signal and the third digital signal is equal to or less than a predetermined second threshold, the second comparator controls the switching unit to permit the output of the first digital signal to the first comparator, and
    when a result of the second comparison process indicates that the difference between the second digital signal and the third digital signal is larger than the predetermined second threshold, the second comparator controls the switching unit to forbid the output of the first digital signal to the first comparator.

2. The analog input device according to claim 1, wherein the switching unit is configured by a switching element arranged between the high resolution analog to digital converter and the first comparator.

3. The analog input device according to claim 1, wherein, when the result of the first comparison process indicates that the difference between the first digital signal and the second digital signal is equal to or less than the predetermined first threshold, the digital signal output unit outputs the first digital signal to an external device which is included in the industrial control apparatus via a communication bus of the industrial control apparatus.

4. The analog input device according to claim 3, wherein the analog signal is output from a sensor, and
the external device is provided by a control device that generates a command according to a detection value of the analog signal output from the sensor and outputs the generated command to a robot controller that controls an operation of a robot.

5. An analog input device, which converts an analog signal input to the analog input device to a digital signal and outputs the digital signal that is converted, the analog input device comprising:
a high resolution analog to digital converter executing an analog to digital conversion to the analog signal with a first resolution and outputting a first digital signal that is converted;
a first microcomputer including a first low resolution analog to digital converter, the first low resolution analog to digital converter executing an analog to digital conversion to the analog signal with a second resolution and outputting a second digital signal that is converted, and the second resolution being lower than the first resolution;
a second microcomputer including a second low resolution analog to digital converter, the second low resolution analog to digital converter executing an analog to digital conversion to the analog signal with the second resolution and outputting a third digital signal that is converted;
an application specific integrated circuit including a first comparator, the first comparator comparing the first digital signal output from the high resolution analog to digital converter with the second digital signal output from the first low resolution analog to digital converter as a first comparison process, the application specific integrated circuit outputting the first digital signal when a result of the first comparison process indicates that a difference between the first digital signal and the second digital signal is equal to or less than a predetermined first threshold, and the application specific integrated circuit stopping an output of the first digital signal when a result of the first comparison process indicates that the difference between the first digital signal and the second digital signal is larger than the predetermined first threshold; and
a switching element arranged between the high resolution analog to digital converter and the application specific integrated circuit, the switching element permits or forbids an output of the first digital signal to the first comparator according to an instruction output from at least one of the first microcomputer or the second microcomputer,
wherein
at least one of the first microcomputer or the second microcomputer includes a second comparator that compares the second digital signal output from the first low resolution analog to digital converter with the third digital signal output from the second low resolution analog to digital converter as a second comparison process,
when a result of the second comparison process indicates that a difference between the second digital signal and the third digital signal is equal to or less than a predetermined second threshold, the second comparator controls the switching element to permit the output of the first digital signal to the first comparator, and
when a result of the second comparison process indicates that the difference between the second digital signal and the third digital signal is larger than the predetermined second threshold, the second comparator controls the switching element to forbid the output of the first digital signal to the first comparator.

* * * * *